(12) United States Patent
Xiang et al.

(10) Patent No.: US 10,681,848 B2
(45) Date of Patent: Jun. 9, 2020

(54) ECU, CONTROL BOX AND CFM HAVING THE SAME

(71) Applicant: Johnson Electric S.A., Murten (CH)

(72) Inventors: You Qing Xiang, Shenzhen (CN); Xiao Jun Yan, Shen Zhen (CN); Nan Zheng, Shen Zhen (CN); Yun Chen, Shen Zhen (CN); Hai Dong Wan, Shenzhen (CN); Jian Zhao, Shen Zhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 332 days.

(21) Appl. No.: 15/657,707

(22) Filed: Jul. 24, 2017

(65) Prior Publication Data

US 2018/0034349 A1 Feb. 1, 2018

(30) Foreign Application Priority Data

Jul. 29, 2016 (CN) .......................... 2016 1 0619079

(51) Int. Cl.
*H05K 7/20* (2006.01)
*H02K 11/33* (2016.01)
*H05K 1/09* (2006.01)

(52) U.S. Cl.
CPC ......... *H05K 7/20854* (2013.01); *H02K 11/33* (2016.01); *H05K 1/09* (2013.01); *H05K 2201/10424* (2013.01)

(58) Field of Classification Search
CPC ...... H05K 7/209; H05K 7/20854; H05K 1/09; H02K 1/33
USPC ....................... 361/679.46–679.54, 688–723; 257/712–722
See application file for complete search history.

(56) References Cited

U.S. PATENT DOCUMENTS

| | | | |
|---|---|---|---|
| 6,949,849 B1 * | 9/2005 | Wright ................... | H02K 11/33 310/64 |
| 7,021,418 B2 * | 4/2006 | Tominaga ............ | B62D 5/0406 180/444 |
| 7,365,425 B2 * | 4/2008 | Hayakawa .......... | H01L 23/4006 257/712 |
| 7,886,865 B2 * | 2/2011 | Sekine ................. | B62D 5/0406 180/444 |
| 2013/0119908 A1 * | 5/2013 | Harada ..................... | H02P 6/10 318/400.42 |
| 2017/0164580 A1 * | 6/2017 | Rettedal ............... | A01K 11/007 |

* cited by examiner

*Primary Examiner* — Zachary Pape
(74) *Attorney, Agent, or Firm* — Muncy, Geissler, Olds & Lowe, P.C.

(57) ABSTRACT

An ECU, a control box, and a CMF using the ECU are provided. The control box includes a heat sink and the ECU. The ECU include a support bracket mounted on the heat sink, a power supply board supported by the support bracket, and a signal board stacked over the power supply board and electrically connecting with the power supply board. The support bracket is made of an insulation material. The power supply board carries a plurality of power devices which are in contact with the heat sink for heat dissipation multiple power devices.

16 Claims, 8 Drawing Sheets

…

ECU, CONTROL BOX AND CFM HAVING THE SAME

CROSS REFERENCE TO RELATED APPLICATIONS

This non-provisional patent application claims priority under 35 U.S.C. § 119(a) from Patent Application No. 201610619079.5 filed in The People's Republic of China on Jul. 29, 2016.

FIELD OF THE INVENTION

The present invention relates to ECU (Electronic Control Unit), and in particular to an ECU, a control box, and a CFM (cooling fan module) utilizing the ECU and the control box.

BACKGROUND OF THE INVENTION

A CFM for a vehicle includes an ECU, which traditionally includes a power supply circuit and a signal circuit integrated into a single printed circuit board (PCB). The power supply circuit should be carried by a thick copper foil for high conductivity. Therefore, said single PCB should include thick copper foil, resulting in an increase in cost, volume and weight of the PCB. In addition, the power supply circuit can easily cause interference to the signal circuit. Furthermore, the PCB is traditionally coated with insulting material, which increases a thermal resistance between the PCB and a heat sink mounted on the ECU for heat dissipation.

SUMMARY OF THE INVENTION

Accordingly, one aspect of the present invention provides an ECU which includes: a power supply board; a signal board stacked over the power supply board and electrically connecting with the power supply board; and a support bracket made of insulation material supporting the power supply board and disposed between the power supply board and signal board.

Preferably, a plurality of pins extends from the power supply board, the signal board define a plurality of connecting holes corresponding to the pins, and the pins are correspondingly received in the connecting holes to enable electrical connections between the signal board and the power supply board.

Preferably, the pins are fixed in the holes by soldering.

Preferably, the support bracket is over-molded on the power supply board to make an integrated structure together with the power supply board.

Preferably, the support bracket comprises an isolating portion configured to electrically insulate the power supply board from another electrically conductive part.

Preferably, the isolating portion is disposed at one side of the support bracket facing the signal board, the isolating portion separates the power supply board from the signal board by a preset distance, such that the power supply board is electrically insulated from the signal board except for the electrical connections at the multiple locations.

Preferably, the isolating portion is disposed at one side of the support bracket opposite from the signal board.

Preferably, the isolating portion is disposed at an outer periphery of the power supply board.

Preferably, the support bracket is substantially a plate-shaped bracket with a plurality of cutouts, the power supply board is partially exposed through the cutouts of the support bracket.

Preferably, the power supply board carries a power supply circuit, which includes some power devices mounted on the power supply board.

Another aspect of the present invention provides a control box which includes a heat sink and an ECU aforementioned above. The support bracket of the ECU is mounted on the heat sink. The power supply board carries a plurality of power devices in contact with the heat sink for heat dissipation.

Preferably, the support bracket is over-molded on the power supply board to make an integrated structure together with the power supply board.

Preferably, the plurality of the power devices comprises a plurality of power switching transistors, one side of each power switching transistor is coated with an electrically insulative and thermally conductive layer, and each power switching transistor is in direct contact with the heat sink through the electrically insulative and thermally conductive layer for heat dissipation.

Preferably, the control box further comprises a cover portion, and the cover portion and the heat sink together form an accommodating space accommodating the ECU.

Preferably, the support bracket includes an isolating portion configured to electrically insulate the power supply board from another electrically conductive part.

Preferably, the isolating portion separates the power supply board from the signal board by a preset distance.

Preferably, the isolating portion separates the power supply board from the heat sink by a preset distance, such that the power supply board is electrically insulated from the heat sink.

Still another aspect of the present invention provides a CFM which includes a motor and the ECU or the control box as described above to drive the motor.

BRIEF DESCRIPTION OF THE DRAWINGS

The present invention is described below in greater detail with reference to the drawings and embodiments.

The present invention will be described below in greater detail with reference to the drawings and embodiments.

DETAILED DESCRIPTION OF THE PREFERRED EMBODIMENTS

Figure 1:
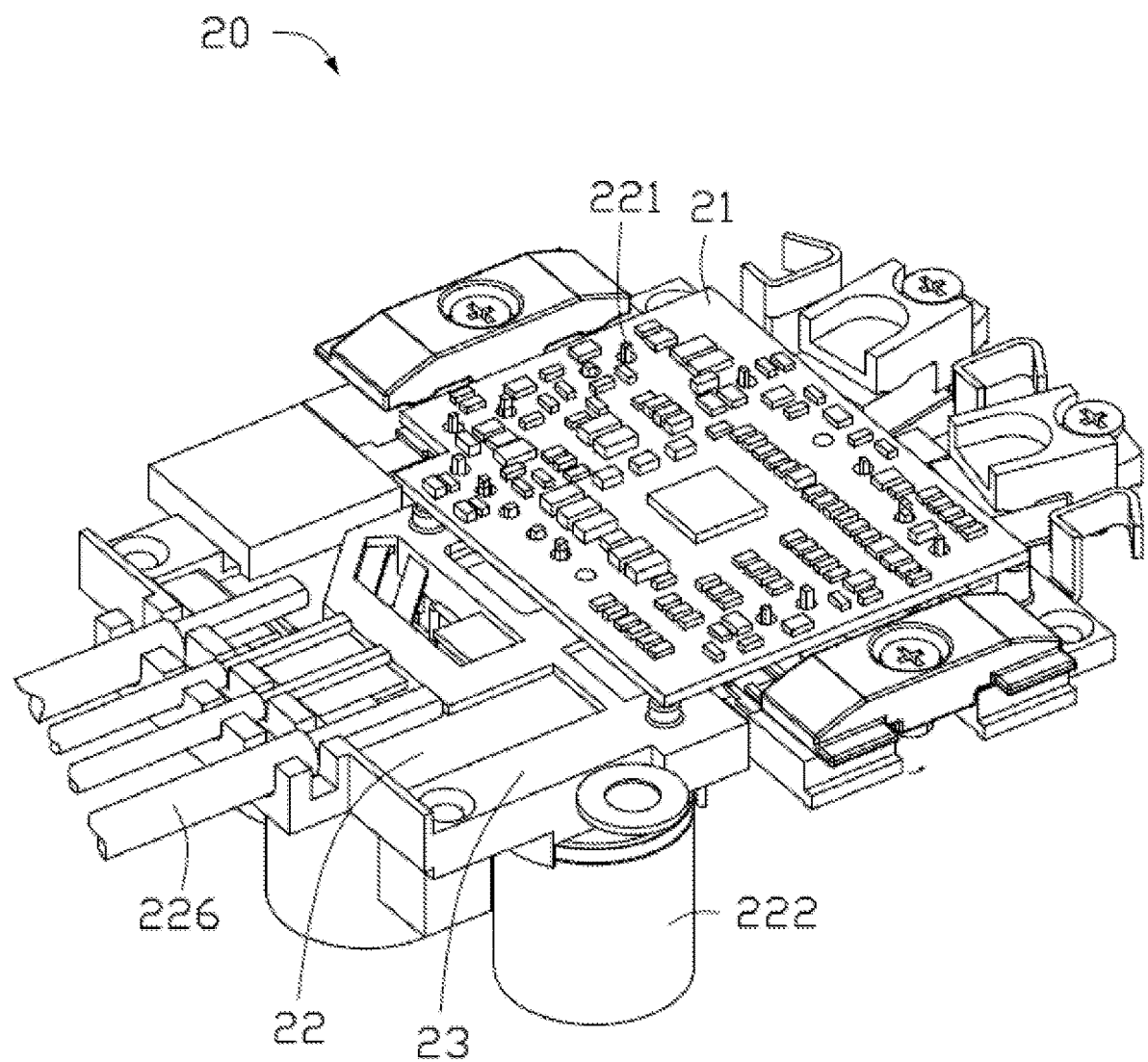
FIG. 1 is a perspective view of an ECU according to one embodiment of the present invention.
Figure 2:
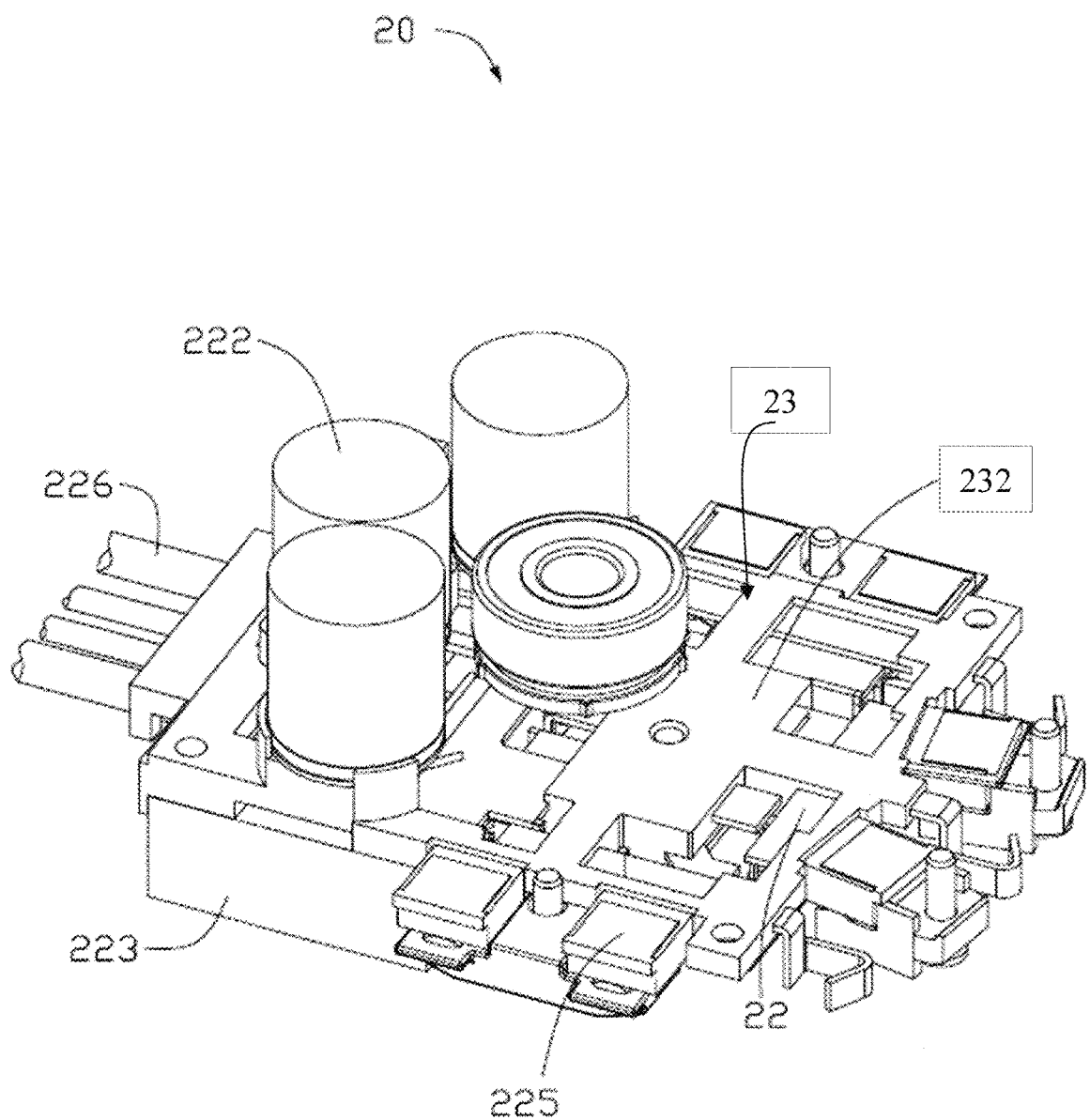
FIG. 2 is a perspective view of the ECU of FIG. 1, viewed from another aspect.
Figure 3:
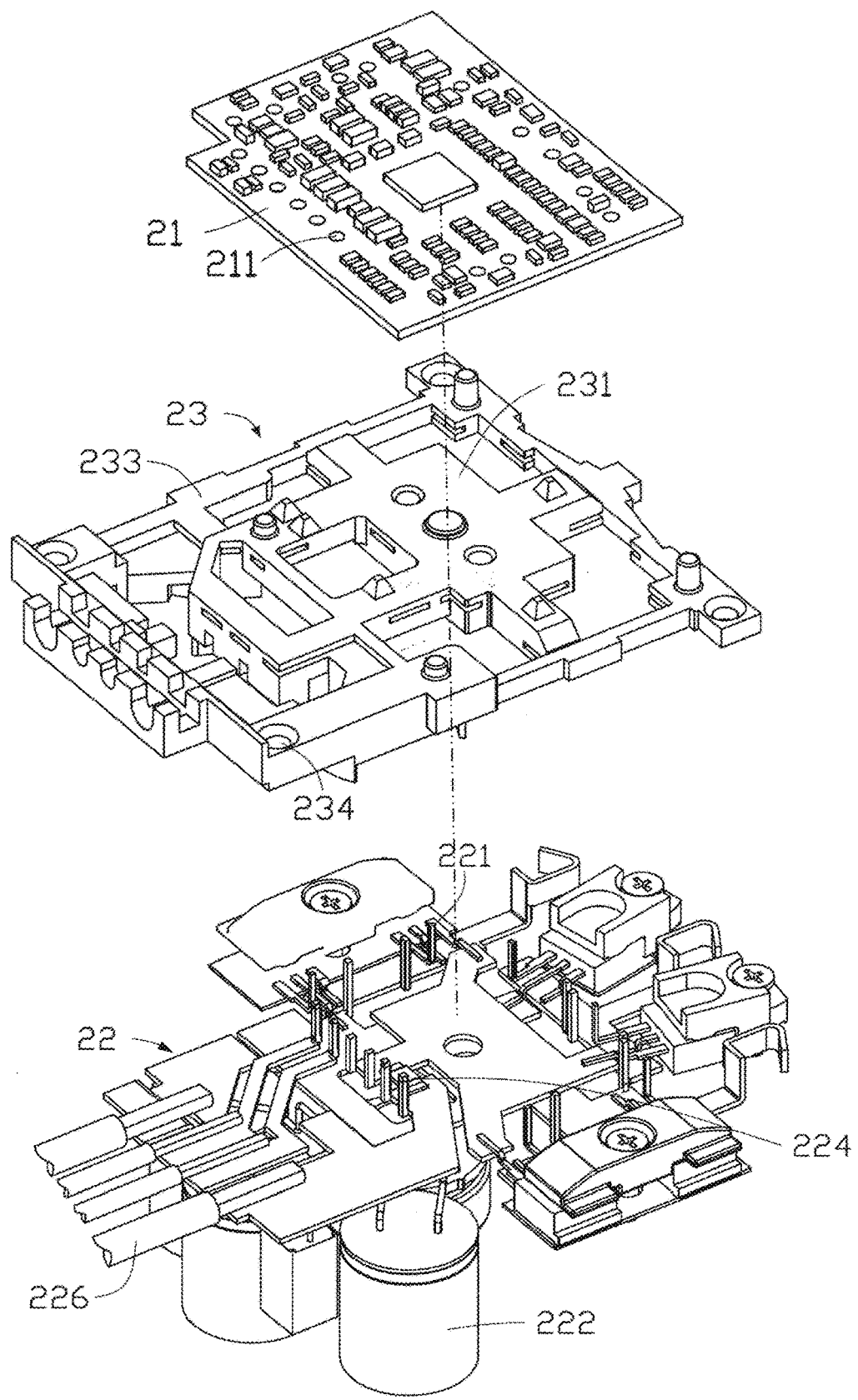
FIG. 3 is an exploded view of the ECU of FIG. 1.
Figure 4:
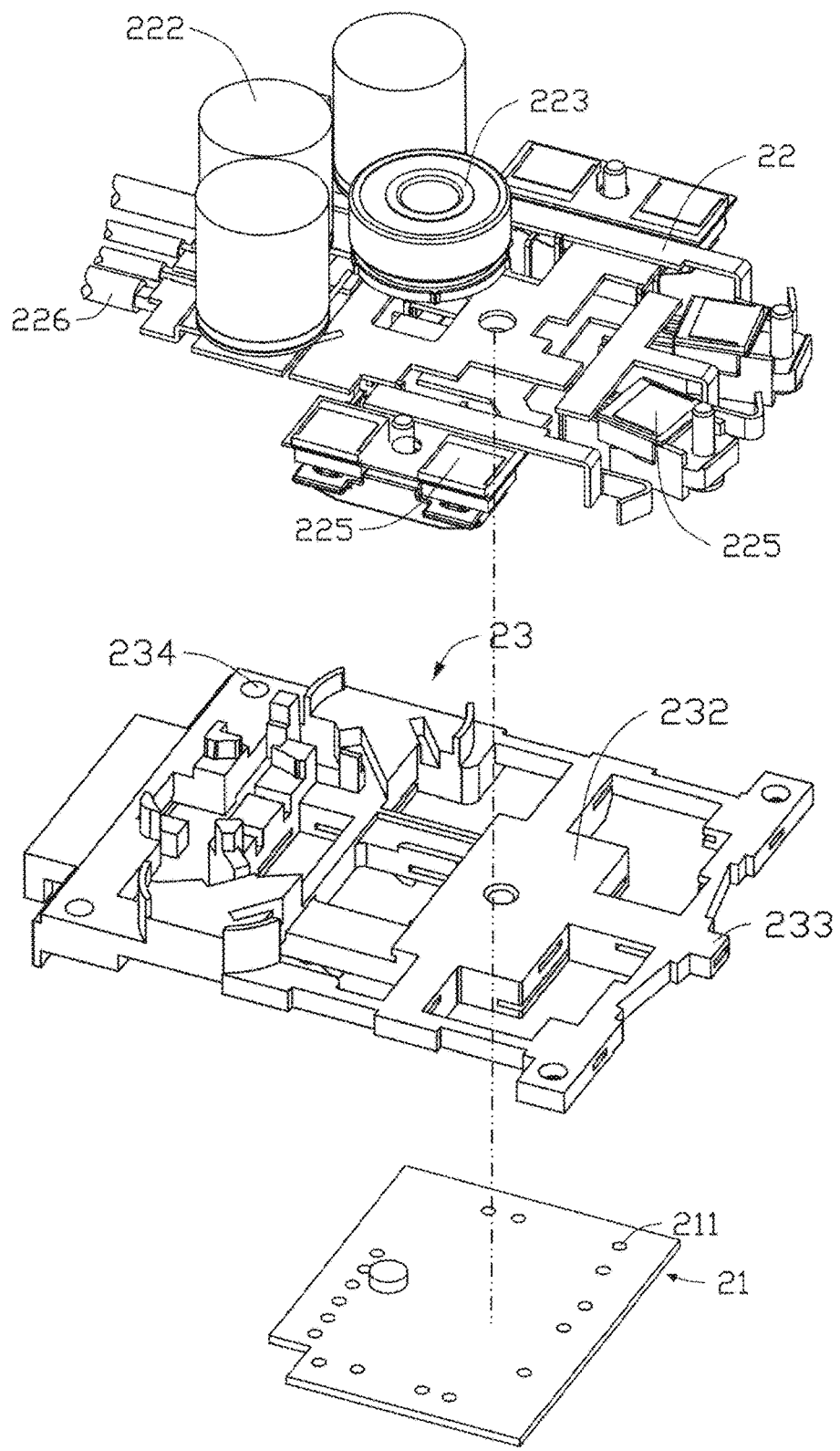
FIG. 4 is an exploded view of the ECU of FIG. 1, viewed from another aspect.

Below, embodiments of the present invention will be described in greater detail with reference to the drawings. Elements of similar structures or functions are generally represented by like reference numerals for illustrative purposes throughout the figures. It should be noted that the figures are illustrative rather than limiting. The figures are not drawn to scale, do not illustrate every aspect of the described embodiments, and do not limit the scope of the present disclosure. Unless otherwise specified, all technical and scientific terms used in this disclosure have the ordinary meaning as commonly understood by people skilled in the art.

It is noted that, when a component is described to be "fixed" or "mounted" to another component, it can be directly fixed or mounted to the another component or there may be an intermediate component. When a component is described to be "connected" to another component, it can be directly connected to the another component or there may be an intermediate component. When a component is described to be "disposed" on another component, it can be directly disposed on the another component or there may be an intermediate component.

Referring to FIGS. 1 to 4, an ECU 20 in accordance with one embodiment of the present invention includes a signal board 21 and a power supply board 22. The signal board 21 is stacked over the power supply board 22, and is electrically connected with the power supply board 22 via a plurality of pins or terminals 221. The signal board 21 is a printed circuit boards (PCBs). The power board 22 is a bare copper sheet forming some electric patterns. The pins 221 protrude from the circuit board 22. The signal board 21 defines a plurality of connecting holes 211. The pins 221 are corresponding to be inserted into the connecting holes 211, and are electrically connected with the circuit on the signal board 21. In this embodiment, after being disposed in the respective connecting holes 211, the pins 221 are further fixed to the connecting holes 211 by soldering. In alternative embodiments, the pins may also protrude from the signal board 21, and the power supply board 22 defines the holes.

Figure 5:
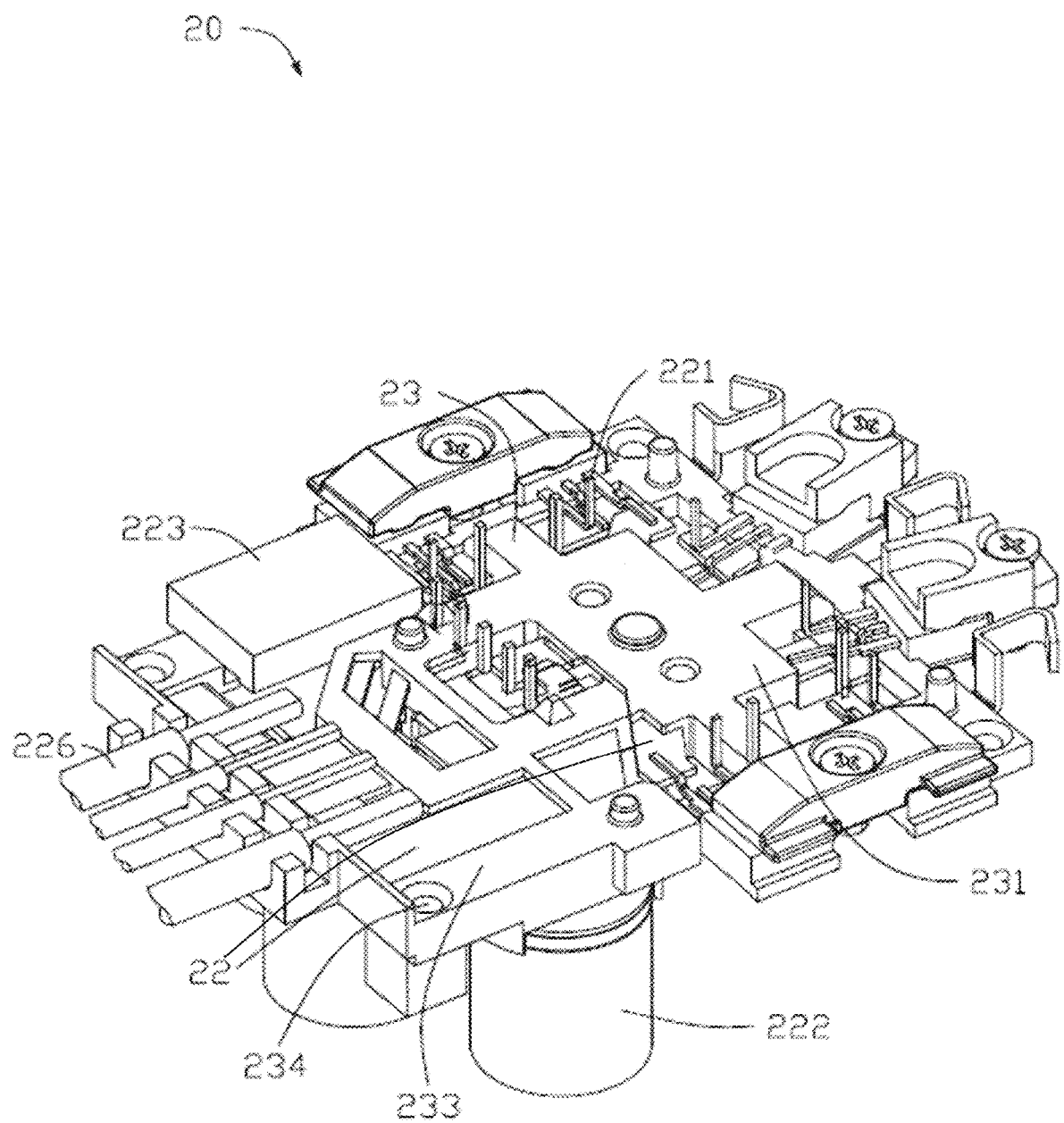
FIG. 5 is a perspective view of the ECU of FIG. 1, with a signal board being removed.

The ECU 20 further includes a support bracket 23. In one embodiment, the support bracket 23 is made of insulation material such as plastics, and over-molded on the power supply board to make an integrated structure together with the power supply board. The support bracket 23 includes a first isolating portion 231. The first isolating portion 231 is disposed at a side of the support bracket 23 facing the signal board 21, for separating the circuit 22 from the signal board 21 by a distance. As such, the power supply board 22 and the signal board 21 do not contact each other (i.e. are electrically insulated), except for the electrical connections via the pins 221. In this embodiment, referring to FIG. 5, the support bracket 23 is substantially a plate-shaped bracket with a plurality of cutouts therein. The power supply board 22 is partially exposed through the cutouts of the support bracket 23. The signal board 21 and the power supply board 22 are respectively disposed at opposite sides of the support bracket 23, which insulates the signal board 21 from the power supply board 22.

The support bracket 23 may further include a second isolating portion 232 disposed at a side of the support bracket 23 opposite from the signal board 21. The support bracket 23 may further include a third isolating portion 233 surrounding the power supply board 22. Alternatively, the third isolating portion 233 is disposed at one or multiple specific locations around the circuit board. In short, if it is desired to isolate the power supply board 22 from another electrically conductive part for electric insulation, an isolating portion may be disposed at a corresponding location of the support bracket.

The support bracket 23 may further include one or more mounting portions 234, through which the ECU 20 is mounted to another part or device. The mounting portions 234 may be disposed on the isolating portions 231, 232, and/or 233. Alternatively, the mounting portions 235 may also be disposed at other locations on the support bracket 23. Thus, it is not intended to limit the mounting portion 234 to any particular location as described herein. In this embodiment, the mounting portions 234 are implemented as multiple mounting holes defined in the third isolating portion 233. The mounting holes may directly engage with mounting structures on the other part or device so as to mount the ECU 20 to the other part or device. Alternatively, some connecting members such as thread connecting members may be used in combination with the mounting holes/mounting structures to mount the ECU 20 to the other part or device. In other embodiments, the mounting portions 234 may be snap-fit structures which may engage with snap-fit structures of the other part or device to mount the ECU 20 to the other part or device.

The power supply board 22 are configured to transfer electric power from an external power source to a motor of the CFM with a desired way. The power supply board 22 carries a power supply circuit, which includes some power devices such as capacitors 222, inductors 223, resistors 224 and power switching transistors 225 (e.g. power MOSFETs) mounted on the power supply board 22. In this embodiment, the power devices are soldered to the power supply board 22. The power switching transistors 225 are located on an outer edge of the power supply board 22, and one side of each power switching transistor 225 facing the signal board 11 is encapsulated in an insulation material to ensure electric insulation from the signal board 21. The other side of each power switching transistor 225 opposite from the signal board 21 is coated with an electrically isolative and thermally conductive layer. The capacitors 222 are located on the side of the power supply board 22 opposite from the signal board 21. The inductors 223 and the resistors 224 are located on the side of the power supply board 22 facing the signal board 21. The mounting location of the power devices on the power supply board 22 may be various in other embodiment. Lead wires 226 may also be provided at corresponding locations on the power supply board 22, for electrical connection with the external power source and/or an external control unit. In alternative embodiments, the Lead wires may not be included; rather, connecting interfaces are provided at the corresponding location for electrical connection with the external power source and/or external control unit.

Figure 6:
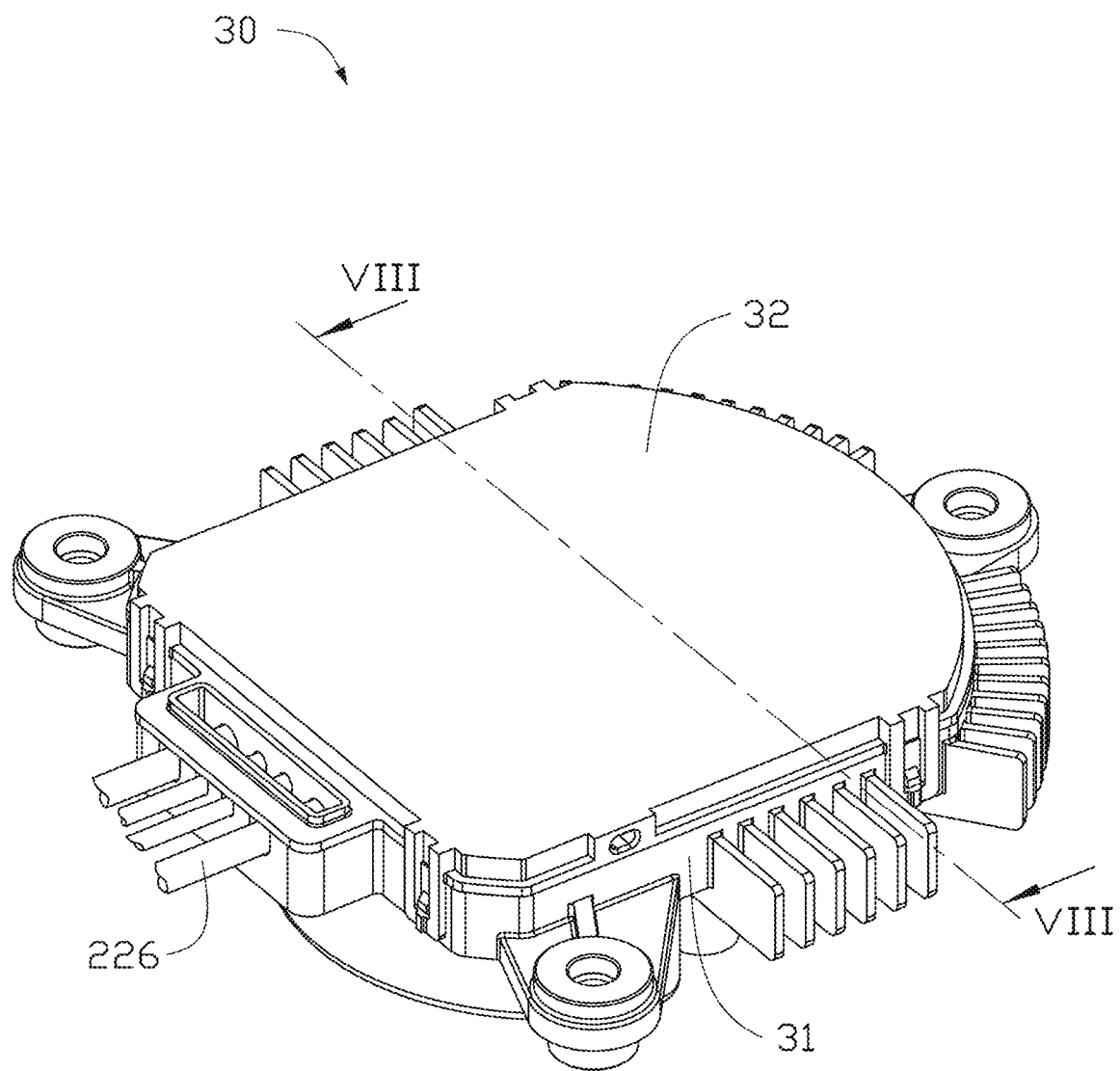
FIG. 6 is an exploded view of a control box according to one embodiment of the present invention.
Figure 7:
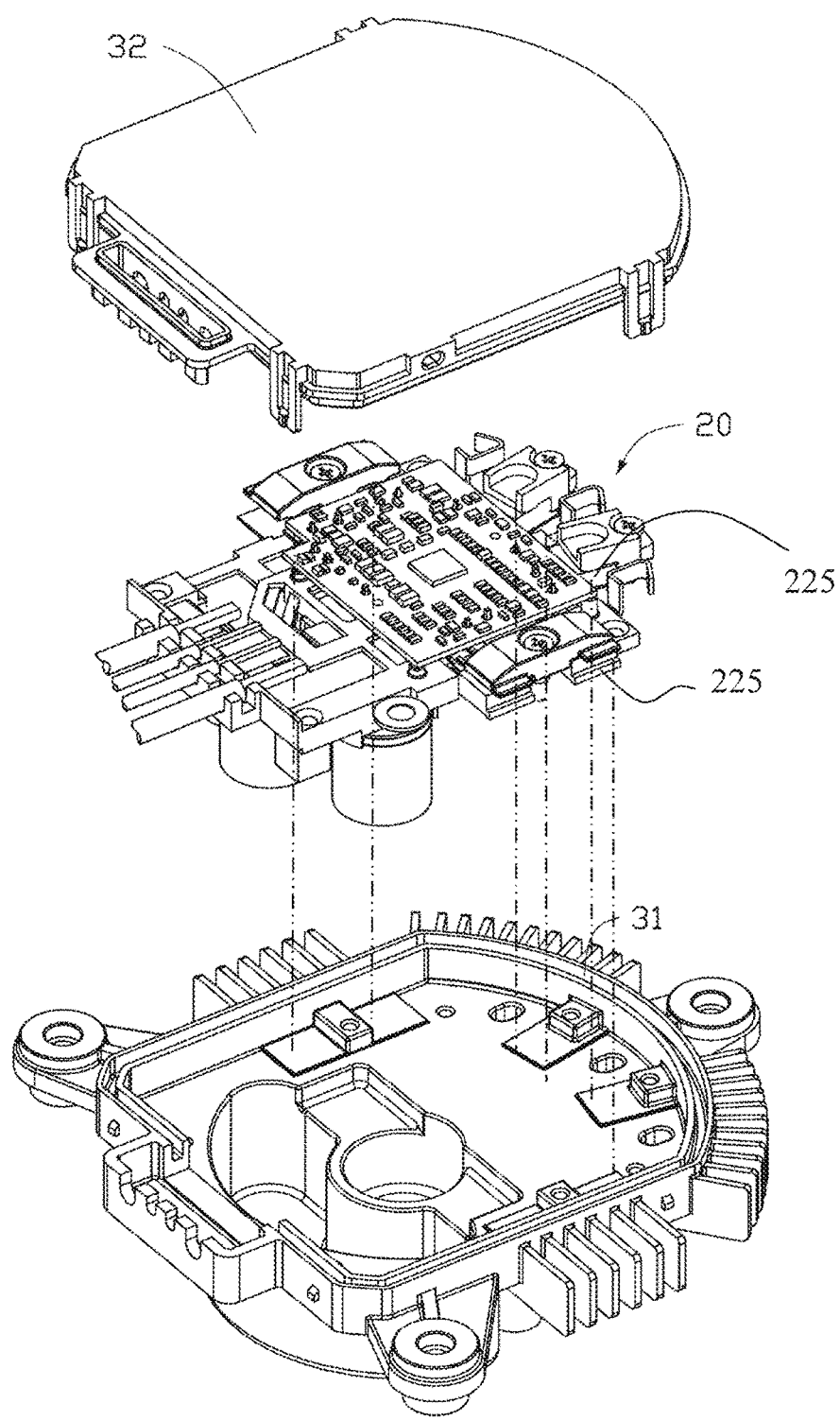
FIG. 7 is a perspective, assembled view of the control box of FIG. 6.
Figure 8:
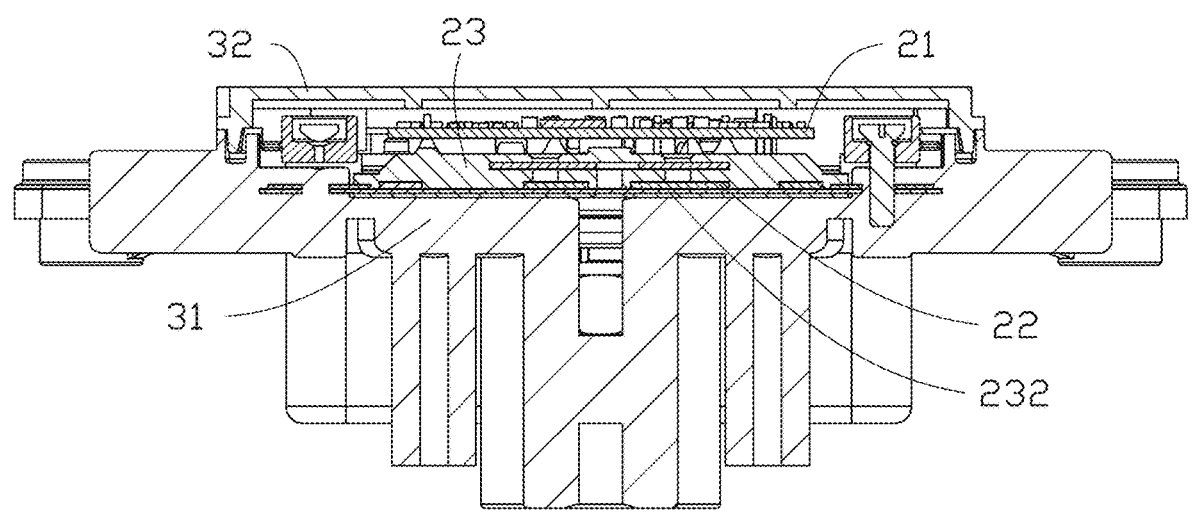
FIG. 8 is a cross-sectional view of the control box.

Referring to FIGS. 6 and 7, an electric control box 30 with a heat sink is illustrated. The electric control box 30 includes the ECU 20 and a heat sink 31. The ECU 20 is mounted on the heat sink 31. In particular, the support bracket 23 of the ECU 20 is mounted on the heat sink 31 through the mounting portions 234, with the power supply board 22 located adjacent the heat sink 31 and the signal board 21 away from the heat sink 31. Part of the power devices on the power supply board 22, such as, the capacitors 222, are in direct contact with the heat sink for heat dissipation. The power switching transistors 225, after coated with the electrically insulative and thermally conductive layer, are also in direct contact with the heat sink 31 for heat dissipation. As such, the thermal resistance between the power supply board 22 and the power devices mounted thereon, which are the largest heat source in the ECU 20, and the heat sink 31 is reduced in comparison with the prior art, and the generated heat can thus be more quickly conducted to the heat sink 31 and dissipated to the surrounding environment. Therefore, this can ensure more stable performance of the power supply board 22 and the power devices mounted thereon and hence more stable performance of the ECU 20. The electric control box 30 further includes a cover portion 32. The cover portion 32 and the heat sink 31 together form a housing of the control box 30, and the ECU 20 is disposed in an interior accommodating space of the housing. The lead wires 226 extend out of the control box 30 via openings of the housing. In this embodiment, the cover portion 32 is snap-fit on the heat sink 31, and the cover portion 32 and the heat sink 31 cooperatively form the openings. In an alternative embodiment, the cover portion 32 may be fixed on the heat sink 31 in another manner, and the openings for allowing the lead wires 226 to lead out may be defined in the cover portion 32 or in the heat sink 32. Thus, it is not intended to limit the locations of the openings to particular locations as described herein.

The ECU 20 and the control box 30 according to embodiments of the present invention may be applied in a CFM to driving the motor of CFM. It should be understood that the ECU 20 and the control box 30 according to embodiments of the present invention are not limited to the application in the CFM but instead can be equally applied in various electric appliances or electronic products.

In the ECU and the control box according to embodiments of the present invention, the power supply board and the signal board are provided as separate PCBs, rather than integrated into one PCB, which can reduce the thickness of the signal board, the PCB cost, and hence the cost, volume and weight of the ECU. In addition, because the power supply board and the signal board are not integrated into one PCB, the interference of the power supply circuit on the power supply board to the signal circuit on the signal board can be suppressed. Furthermore, the power supply board and the support bracket are connected into one integrated structure by over-molding, which simplifies the assembly between the ECU and the control box. Moreover, the support bracket is formed as a hollowed-out plate-shaped structure and, therefore, when it is desired to electrically insulate the power supply board from another electrically conductive part, the support bracket can simply protrude at a corresponding location thereon to form an isolating portion. When compared with the prior art, this not only reduces the weight and cost of the ECU and the control box, but it also reduces the thermal resistance between the power supply board and the heat sink.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated herein should not be interpreted as limits to the present invention, and the scope of the invention is to be determined by reference to the claims that follow.

The invention claimed is:

1. An ECU comprising:
a power supply board comprising bare copper sheet forming some electric pattern;
a signal board comprising a PCB stacked over the power supply board and electrically connecting with the power supply board; and
a support bracket made of insulation material supporting the power supply board and disposed between the power supply board and signal board,
wherein the support bracket comprises a plurality of isolating portions, two of the plurality of isolating portions cooperatively sandwich the power supply board, and are respectively raised from opposite sides of the power supply board.

2. The ECU of claim 1, wherein a plurality of pins extends from the power supply board, the signal board defines a plurality of connecting holes corresponding to the pins, and the pins are correspondingly received in the connecting holes to enable electrical connections between the signal board and the power supply board.

3. The ECU of claim 2, wherein the pins are fixed in the holes by soldering.

4. The ECU of claim 1, wherein the support bracket is over-molded on the power supply board to make an integrated structure together with the power supply board.

5. The ECU of claim 4, wherein the plurality of isolating portions configured to electrically insulate the power supply board from another electrically conductive part.

6. The ECU of claim 5, wherein one of the isolating portions is disposed at one side of the support bracket facing the signal board, the isolating portion separates the power supply board from the signal board by a preset distance, such that the power supply board is electrically insulated from the signal board except for the electrical connections at the multiple locations.

7. The ECU of claim 5, wherein one of the isolating portions is disposed at an outer periphery of the power supply board.

8. The ECU of claim 5, wherein the support bracket is substantially a plate-shaped bracket with a plurality of cutouts, the power supply board is partially exposed through the cutouts of the support bracket.

9. The ECU of claim 1, wherein the power supply board carries a power supply circuit, which includes some power devices mounted on the power supply board.

10. A CFM comprising:
a motor; and
an ECU of claim 1 adapted to drive the motor, the ECU comprising:
the power supply board configured to transfer electric power from an external power source to the motor of the CFM.

11. The CFM of claim 10, further comprising a heat sink, wherein the support bracket is mounted on the heat sink, and the power supply board carrying a plurality of power devices in contact with the heat sink for heat dissipation.

12. A control box comprising:
a heat sink; and
an ECU comprising:
a support bracket mounted on the heat sink, the support bracket being made of insulation material;
a power supply board supported by support bracket, and carrying a plurality of power devices which are in contact with the heat sink for heat dissipation; and
a signal board stacked over the power supply board and electrically connecting with the power supply board,
wherein the support bracket includes a plurality of isolating portions configured to electrically insulate the power supply board from another electrically conductive part; the support bracket includes a plurality of isolating portions configured to electrically insulate the power supply board from another electrically conductive part, one of the isolating portions separates the power supply board from the heat sink by a preset distance, such that the power supply board is electrically insulated from the heat sink.

13. The control box of claim 12, wherein the support bracket is over-molded on the power supply board to make an integrated structure together with the power supply board.

14. The control box of claim 12, wherein the plurality of the power devices comprises a plurality of power switching transistors, one side of each power switching transistor is coated with an electrically insulative and thermally conductive layer, and each power switching transistor is in direct contact with the heat sink through the electrically insulative and thermally conductive layer for heat dissipation.

15. The control box of claim 12, wherein the control box further comprises a cover portion, and the cover portion and the heat sink together form an accommodating space accommodating the ECU.

16. The control box of claim 11, wherein one of the isolating portions separates the power supply board from the signal board by a preset distance.

* * * * *